US009321085B2

(12) United States Patent
Minami et al.

(10) Patent No.: US 9,321,085 B2
(45) Date of Patent: Apr. 26, 2016

(54) SUBSTRATE PROCESSING METHOD, STORAGE MEDIUM STORING COMPUTER PROGRAM FOR IMPLEMENTING SUBSTRATE PROCESSING METHOD AND SUBSTRATE PROCESSING APPARATUS (71) Applicant: Tokyo Electron Limited, Tokyo (JP)

(72) Inventors: Teruomi Minami, Koshi (JP); Satoru Tanaka, Koshi (JP); Tatsuya Nagamatsu, Koshi (JP); Hiroyuki Suzuki, Koshi (JP); Yosuke Kawabuchi, Koshi (JP); Tsukasa Hirayama, Koshi (JP); Katsufumi Matsuki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 755 days.

(21) Appl. No.: 13/687,142

(22) Filed: Nov. 28, 2012

(65) Prior Publication Data
US 2013/0133695 A1 May 30, 2013

(30) Foreign Application Priority Data

Nov. 30, 2011 (JP) ................................. 2011-262678

(51) Int. Cl.
B08B 3/04 (2006.01)
B08B 7/04 (2006.01)
H01L 21/67 (2006.01)
(52) U.S. Cl.
CPC ............ *B08B 3/04* (2013.01); *H01L 21/67034* (2013.01)
(58) Field of Classification Search
CPC .................... B08B 3/04; H01L 21/67034
See application file for complete search history.

(56) References Cited

U.S. PATENT DOCUMENTS

| 6,503,335 | B2* | 1/2003 | Hohl ...................... C30B 33/00 134/17 |
| 6,730,176 | B2* | 5/2004 | Kuyel ............... H01L 21/67051 134/1 |
| 7,806,989 | B2* | 10/2010 | Sekiguchi ................ B08B 3/02 134/26 |
| 8,911,561 | B2* | 12/2014 | Kraus ............... H01L 21/67034 134/32 |
| 2002/0170576 | A1* | 11/2002 | Hohl ...................... C30B 33/00 134/30 |
| 2007/0295365 | A1* | 12/2007 | Miya ................. H01L 21/02057 134/26 |

(Continued)

FOREIGN PATENT DOCUMENTS

JP 2007-036180 A 2/2007
JP 2008-034779 A 2/2008

(Continued)

*Primary Examiner* — Alexander Markoff
(74) *Attorney, Agent, or Firm* — Pearne & Gordon LLP (57) ABSTRACT

A chemical liquid process is performed on a substrate. Then, a rinse process that supplies a rinse liquid to the substrate is performed. Thereafter, a drying process that dries the substrate is performed while rotating the substrate. The drying process includes a first drying process that rotates the substrate at a first rotational speed; a second drying process that decreases the rotational speed of the substrate to a second rotational speed lower than the first rotational speed after the first drying process. In the second drying process, the rinse liquid and a drying solution are agitated and substituted while generating braking effect. In a third drying process, the rotational speed of the substrate is increased from the second rotational speed to a third rotational speed after the second drying process. Thereafter, in a fourth drying process, the drying solution on the substrate is scattered away by rotating the substrate.

7 Claims, 5 Drawing Sheets

(56) References Cited

U.S. PATENT DOCUMENTS

| | | | |
|---|---|---|---|
| 2008/0078426 A1* | 4/2008 | Miya | H01L 21/67028 134/30 |
| 2008/0176407 A1* | 7/2008 | Nagakura | H01L 21/67028 438/703 |
| 2009/0032067 A1* | 2/2009 | Kojimaru | H01L 21/67034 134/26 |
| 2011/0308549 A1* | 12/2011 | Minami | H01L 21/02052 134/18 |
| 2011/0315169 A1* | 12/2011 | Minami | H01L 21/67051 134/30 |
| 2014/0259728 A1* | 9/2014 | Ishibashi | H01L 21/02074 34/381 |

FOREIGN PATENT DOCUMENTS

| | | |
|---|---|---|
| JP | 2009-059895 A | 3/2009 |
| JP | 2009-212407 A | 9/2009 |

* cited by examiner

SUBSTRATE PROCESSING METHOD, STORAGE MEDIUM STORING COMPUTER PROGRAM FOR IMPLEMENTING SUBSTRATE PROCESSING METHOD AND SUBSTRATE PROCESSING APPARATUS

CROSS-REFERENCE TO RELATED APPLICATION

This application claims the benefit of Japanese Patent Application No. 2011-262678 filed on Nov. 30, 2011, the disclosures of which are incorporated herein by reference.

FIELD OF THE INVENTION

The present disclosure relates to a substrate processing method and a storage medium storing thereon a computer program for implementing the substrate processing method, and also relates to a substrate processing apparatus.

BACKGROUND OF THE INVENTION

In a manufacturing process of, e.g., a semiconductor device, there is used a substrate processing apparatus in which a wafer (substrate) is held on a spin chuck and the wafer is cleaned by supplying a chemical liquid to the wafer while rotating the wafer (see, for example, Patent Document 1).

When cleaning the wafer by using such a substrate processing apparatus, a dilute hydrofluoric acid (DHF) solution is discharged to the wafer, and a chemical liquid cleaning process by using the DHF solution is performed. Then, pure wafer (rinse liquid) is discharged to the wafer and a rinse process is performed. Thereafter, isopropyl alcohol (IPA) solution is supplied to the wafer so that a drying process is performed on the wafer.

Patent Document 1: Japanese Patent Laid-open Publication No. 2009-059895

In the drying process of the wafer, the wafer is dried after the pure wafer on the wafer surface is substituted with the IPA solution. If, however, the pure water could not be substituted with the IPA solution sufficiently, the pure wafer may remain on the wafer surface during the drying process, and particles may be generated due to this pure water remaining on the wafer surface. Further, in order to substitute the pure water with the IPA solution sufficiently, a large amount of IPA solution may be consumed or a processing time by the IPA solution may become long.

BRIEF SUMMARY OF THE INVENTION

In view of the foregoing problems, illustrative embodiments provide a substrate processing method capable of suppressing particle generation by sufficiently substituting a rinse liquid on a surface of a substrate with a drying solution. Illustrative embodiments also provide a storage medium storing thereon a computer program for implementing this substrate processing method and a substrate processing apparatus.

In accordance with a first aspect of an illustrative embodiment, there is provided a substrate processing method. The substrate processing method includes a chemical liquid process that supplies a chemical liquid to a substrate; a rinse process that supplies a rinse liquid to the substrate after the chemical liquid process; and a drying process that dries the substrate after the rinse process. The drying process includes a first drying process that rotates the substrate at a first rotational speed; a second drying process that decreases a rotational speed of the substrate to a second rotational speed lower than the first rotational speed after the first drying process; and a third drying process that increases the rotational speed of the substrate from the second rotational speed to a third rotational speed after the second drying process. Further, a drying solution is supplied to the substrate from a starting time point of the first drying process to a time point falling within the third drying process.

In accordance with another aspect of the illustrative embodiment, there is provided a storage medium having stored thereon a computer program for implementing a substrate processing method. The substrate processing method includes a chemical liquid process that supplies a chemical liquid to a substrate; a rinse process that supplies a rinse liquid to the substrate after the chemical liquid process; and a drying process that dries the substrate after the rinse process. The drying process includes a first drying process that rotates the substrate at a first rotational speed; a second drying process that decreases a rotational speed of the substrate to a second rotational speed lower than the first rotational speed after the first drying process; and a third drying process that increases the rotational speed of the substrate from the second rotational speed to a third rotational speed after the second drying process. Further, a drying solution is supplied to the substrate from a starting time point of the first drying process to a time point falling within the third drying process.

In accordance with still another aspect of the illustrative embodiment, there is provided a substrate processing apparatus. The substrate processing apparatus includes a substrate holding unit configured to be rotatable and to hold a substrate thereon; a rotation driving unit configured to rotate the substrate holding unit at a first rotational speed, to decrease a rotational speed of the substrate holding unit to a second rotational speed lower than the first rotational speed, and then, to increase the rotational speed of the substrate holding unit from the second rotational speed to a third rotational speed; a chemical liquid supply device configured to supply a chemical liquid to the substrate held on the substrate holding unit; a rinse liquid supply device configured to supply a rinse liquid to the substrate held on the substrate holding unit; and a drying solution supply device configured to supply a drying solution to the substrate held on the substrate holding unit from a starting time point of rotating the substrate holding unit at the first rotational speed to a time point falling within a period where the rotational speed of the substrate holding unit is increased from the second rotational speed to the third rotational speed.

In accordance with the illustrative embodiments, it is possible to prevent particle from being generated on the surface of the substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a substrate processing method, a storage medium storing a computer program for implementing the substrate processing method and a substrate processing apparatus in accordance with an illustrative embodiment will be explained with reference to FIGS. 1 to 5.

First, an overall configuration of a substrate processing apparatus 1 will be described with reference to FIGS. 1 and 2.

Figure 1:
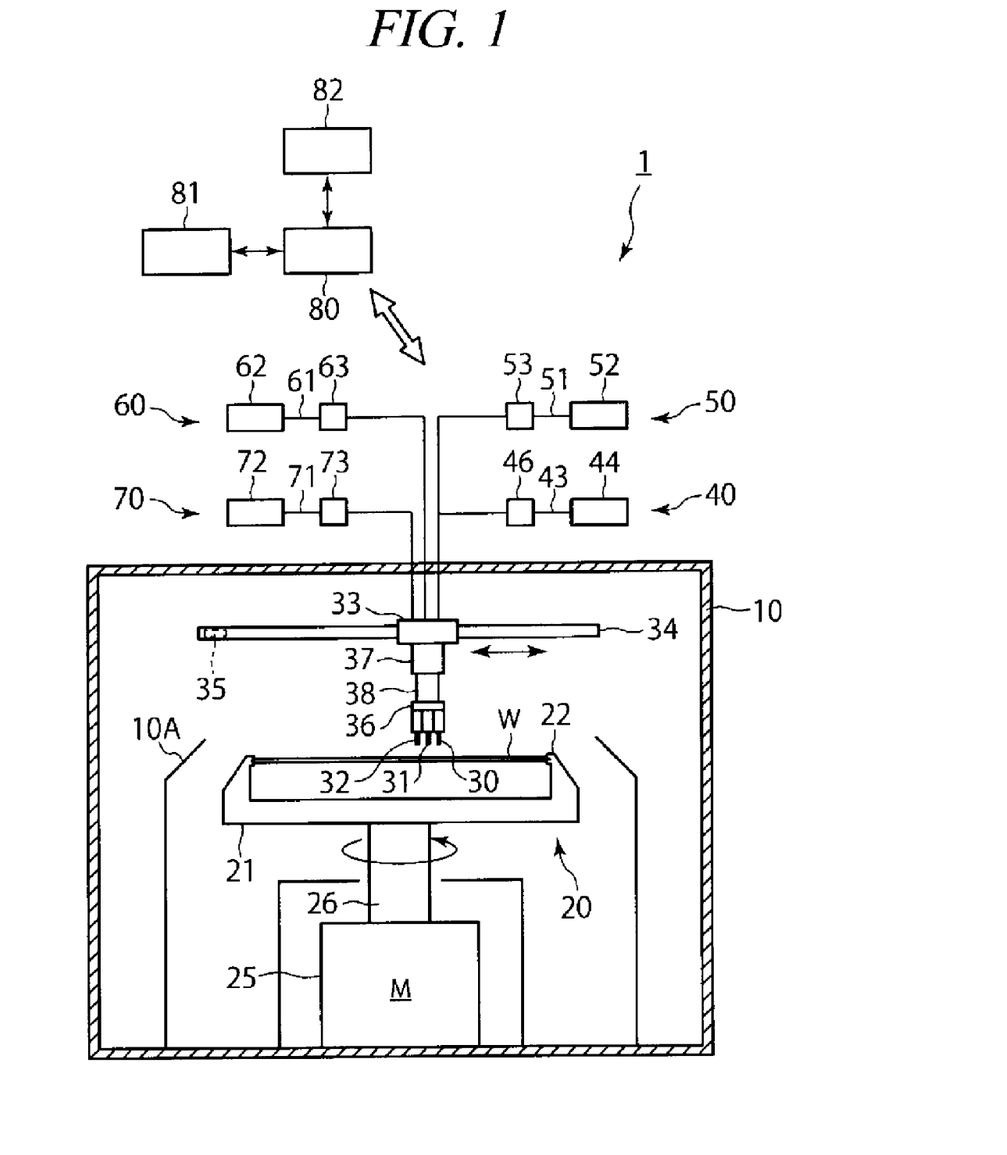
FIG. 1 is a longitudinal cross sectional view illustrating an example sectional configuration of a substrate processing apparatus in accordance with an illustrative embodiment.

As shown in FIG. 1, the substrate processing apparatus 1 includes a processing chamber 10, a rotatable spin chuck (substrate holding unit) 20 for holding thereon a substrate (e.g., a semiconductor wafer, hereinafter, simply referred to as a "wafer W") to be subjected to a cleaning process; and a rotation driving unit (motor) 25 configured to rotate the spin chuck 20.

Figure 2:
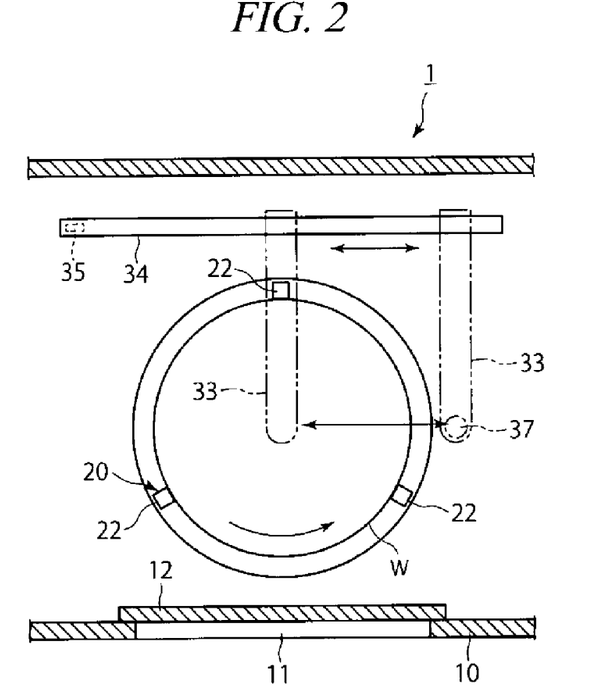
FIG. 2 is a plane view illustrating an example sectional configuration of the substrate processing apparatus in accordance with the illustrative embodiment.

Referring to FIG. 2, a loading/unloading opening 11 for the wafer W is formed at the processing chamber 10, and a shutter 12 is provided at the loading/unloading opening 11 to be opened and closed when the wafer W is loaded or unloaded. Further, the shutter 12 is connected with a controller 80 to be described later, and the shutter 12 is opened and closed in response to a control signal from the controller 80.

Further, the spin chuck 20 and the rotation driving unit 25 are surrounded by a liquid collecting cup 10A provided within the processing chamber 10.

As depicted in FIG. 1, the spin chuck 20 includes a rotation plate 21; and holding members 22 for holding thereon the wafer W. The holding members 22 are provided on a periphery portion of the rotation plate 21 at a regular interval. The holding members 22 hold thereon the wafer W in a substantially horizontal manner.

The rotation driving unit 25 is connected to the rotation plate 21 of the spin chuck 20 via a rotation driving shaft 26. The rotation driving unit 25 is connected with the controller 80. As the rotation driving unit 25 is driven in response to a control signal from the controller 80, the rotation plate 21 is rotated so that the wafer W held on the holding members 22 is rotated about the center thereof on a substantially horizontal plane.

Disposed above the wafer W held on the spin chuck 20 are a cleaning solution nozzle 30 for supplying a chemical liquid or pure water to the wafer W, a drying solution nozzle 31 for supplying a drying solution to the wafer W, and a gas nozzle 32 for supplying an inert gas to the wafer W. The cleaning solution nozzle 30, the drying solution nozzle 31 and the gas nozzle 32 are provided at a leading end of a nozzle arm 33 via a connecting member 36 to be described later. The nozzle arm 33 is moved along a guide rail 34 by a nozzle driving unit 35. Specifically, the guide rail 34 is provided within the processing chamber 10 in a substantially horizontal manner, and a base end of the nozzle arm 33 is fastened to the guide rail 34 so that the nozzle arm 33 is moved along the guide rail 34 in a substantially horizontal direction. In this way, by driving the nozzle driving unit 35, the respective nozzles 30, 31 and 32 are moved as a single body between a position above and corresponding to a central portion of the wafer W (i.e., a position above the central portion of the wafer W) and a position corresponding to a periphery portion of the wafer W (i.e., a position above the periphery portion of the wafer W) in the substantially horizontal direction. Further, the respective nozzles 30, 31 and 32 are also moved as a single body between the position above the periphery portion of the wafer W and a position outside the periphery portion of the wafer W (i.e., a retreated position). In addition, the nozzle driving unit 35 is connected with the controller 80, and the nozzle driving unit 35 is driven in response to a control signal from the controller 80.

The cleaning solution nozzle 30, the drying solution nozzle 31 and the gas nozzle 32 are fastened to the connecting member 36 while arranged adjacent to each other. An elevation driving unit 37 configured to move the respective nozzles 30, 31 and 32 up and down as a single body is disposed between the connecting member 36 and the leading end of the nozzle arm 33. An elevation shaft 38 is provided between the connecting member 36 and the elevation driving unit 37.

The elevation driving unit 37 is connected with the controller 80. The elevation driving unit 37 is driven in response to a control signal from the controller 80, so that the respective nozzles 30, 31 and 32 are moved up and down. With this configuration, heights of the respective nozzles 30, 31 and 32 with respect to the wafer W may be controlled.

The cleaning solution nozzle 30, the drying solution nozzle 31 and the gas nozzle 32 are straightly arranged in a radial direction of the wafer W held on the spin chuck 20. The nozzles 30, 31 and 32 are fastened to the nozzle arm 33 as a single body such that the respective nozzles 30, 31, and 32 can be moved toward the position above the central portion of the wafer W.

The cleaning solution nozzle 30 is connected with a chemical liquid supply device 40, and a chemical liquid is discharged (supplied) to the wafer W held on the spin chuck 20 through the cleaning solution nozzle 30. In accordance with the present illustrative embodiment, the chemical liquid supply device 40 includes a DHF supply source 44 for supplying a DHF solution to the wafer W; and a DHF opening/closing valve 46. The DHF supply source 44 is connected to the cleaning solution nozzle 30 via a DHF supply line 43. Further, a DHF opening/closing valve 46 is provided on the DHF supply line 43. The DHF opening/closing valve 46 is connected with the controller 80, and is opened and closed in response to a control signal from the controller 80.

Further, the cleaning solution nozzle 30 is connected with a rinse liquid supply device 50, and pure water (rinse liquid) is discharged (supplied) to the wafer W held on the spin chuck 20 through the cleaning solution nozzle 30. The rinse liquid supply device 50 includes a rinse liquid supply source 52 for supplying the pure water to the wafer W; and a rinse liquid opening/closing valve 53. The rinse liquid supply source 52 is connected to the cleaning solution nozzle 30 via a rinse liquid supply line 51. Further, the rinse liquid opening/closing valve 53 is provided on the rinse liquid supply line 51. The rinse liquid opening/closing valve 53 is connected with the controller 80, and is opened and closed in response to a control signal from the controller 80.

The DHF supply line 43 and the rinse liquid supply line 51 are joined between the opening/closing valves 46 and 53 and the cleaning solution nozzle 30, respectively.

The drying solution nozzle 31 is connected with a drying solution supply device 60, and a drying solution is discharged (supplied) to the wafer W held on the spin chuck 20 through the drying solution nozzle 31. The drying solution supply device 60 includes a drying solution supply source 62 for supplying a drying solution composed of isopropyl alcohol (IPA) to the wafer W; and a drying solution opening/closing valve 63. The drying solution supply source 62 is connected to the drying solution nozzle 31 via a drying solution supply line 61 and the isopropyl alcohol (IPA) has higher volatility than pure water. Further, the drying solution opening/closing valve 63 is provided on the drying solution supply line 61. The drying solution opening/closing valve 63 is connected with the controller 80, and is opened and closed in response to a control signal from the controller 80.

Further, the gas nozzle 32 is connected with an inert gas supply device 70, and an inert gas is discharged (supplied) to the wafer W held on the spin chuck 20 through the gas nozzle 32. The inert gas supply device 70 includes a gas supply source 72 for supplying a nitrogen gas ($N_2$ gas) to the wafer W as the inert gas; and a gas opening/closing valve 73. The gas supply source 72 is connected to the gas nozzle 32 via a gas supply line 71. Further, the gas opening/closing valve 73 is provided on the gas supply line 71. The gas opening/closing valve 73 is connected with the controller 80, and is opened and closed in response to a control signal from the controller 80.

As stated above, the rotation driving unit 25, the nozzle driving unit 45, the DHF opening/closing valve 46 of the chemical liquid supply device 40, the rinse liquid opening/closing valve 53 of the rinse liquid supply device 50, the drying solution opening/closing valve 63 of the drying solution supply device 60 and the gas opening/closing valve 73 of the inert gas supply device 70 are connected to the controller 80 configured to control their operations.

Referring to FIG. 1, the controller 80 is connected with an input/output device 81 that includes a keyboard through which a process manager inputs commands to manage the substrate processing apparatus 1; a display that visually displays an operational status of the substrate processing apparatus 1; and so forth. Further, the controller 80 is accessible to a storage medium 82 that stores thereon a program for implementing a process in the substrate processing apparatus 1. The storage medium 82 may include an existing storage medium. By way of example, a memory such as a ROM or a RAM, or a disk-shaped storage medium such as a hard disk, a CD-ROM, a DVD-ROM or a flexible disk may be used. The controller 80 executes a program previously stored on the storage medium 82, so that a process on the wafer W is performed in the substrate processing apparatus 1.

Now, an operation of the present illustrative embodiment having the above-described configuration, i.e., a substrate processing method in accordance with the present illustrative embodiment will be discussed. An operation of each component for implementing the substrate processing method to be described below is controlled in response to a control signal from the controller 80 based on the program previously stored on the storage medium 82.

Figure 3:
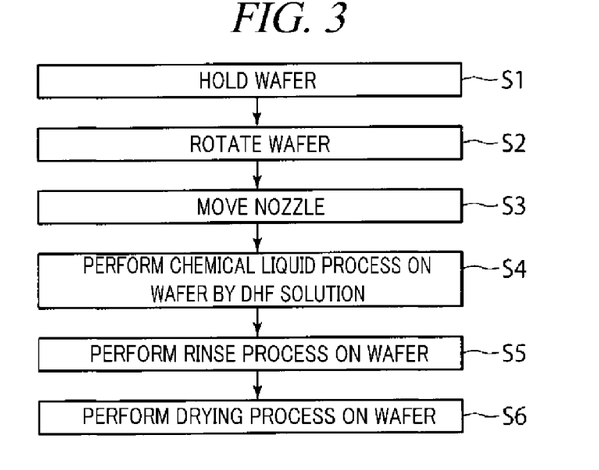
FIG. 3 is a flowchart for describing a sequence of a substrate processing method in accordance with the illustrative embodiment.

First, as shown in FIG. 3, a wafer W having thereon a pattern P is held on the spin chuck 20 (step S1). To elaborate, the shutter 12 is first opened, and the wafer W held on a non-illustrated transfer arm is loaded into the processing chamber 10 through the loading/unloading opening 11. Then, the wafer W is transferred from the transfer arm and is held on the holding members 22 of the spin chuck 20.

Subsequently, the spin chuck 20 holding the wafer W thereon is rotated by the rotation driving unit 25 (step S2).

Then, the nozzle driving unit 35 is driven to move the cleaning solution nozzle 30 located at a retreated position to a position corresponding to the central portion of the wafer W (step S3).

Then, while rotating the wafer W, a chemical liquid process is performed on the wafer W.

To elaborate, a DHF solution is first supplied to a surface of the wafer W, so that a chemical liquid process is performed on the surface of the wafer W by the DHF solution, and thus the wafer W is cleaned (step S4). That is, the DHF opening/closing valve 46 is opened, and the DHF solution is discharged to the central portion of the surface of the wafer W from the DHF supply source 44 via the DHF supply line 43 and the cleaning solution nozzle 30. The discharged DHF solution is diffused to the entire surface of the wafer W by a centrifugal force, and the surface of the wafer W is processed by the DHF solution. Here, desirably, the rotational speed of the wafer W may be set to be in the range from, e.g., about 10 rpm to about 500 rpm. After a liquid film of the DHF solution is formed, the supply of the DHF solution is stopped by closing the DHF opening/closing valve 46.

Figure 4:
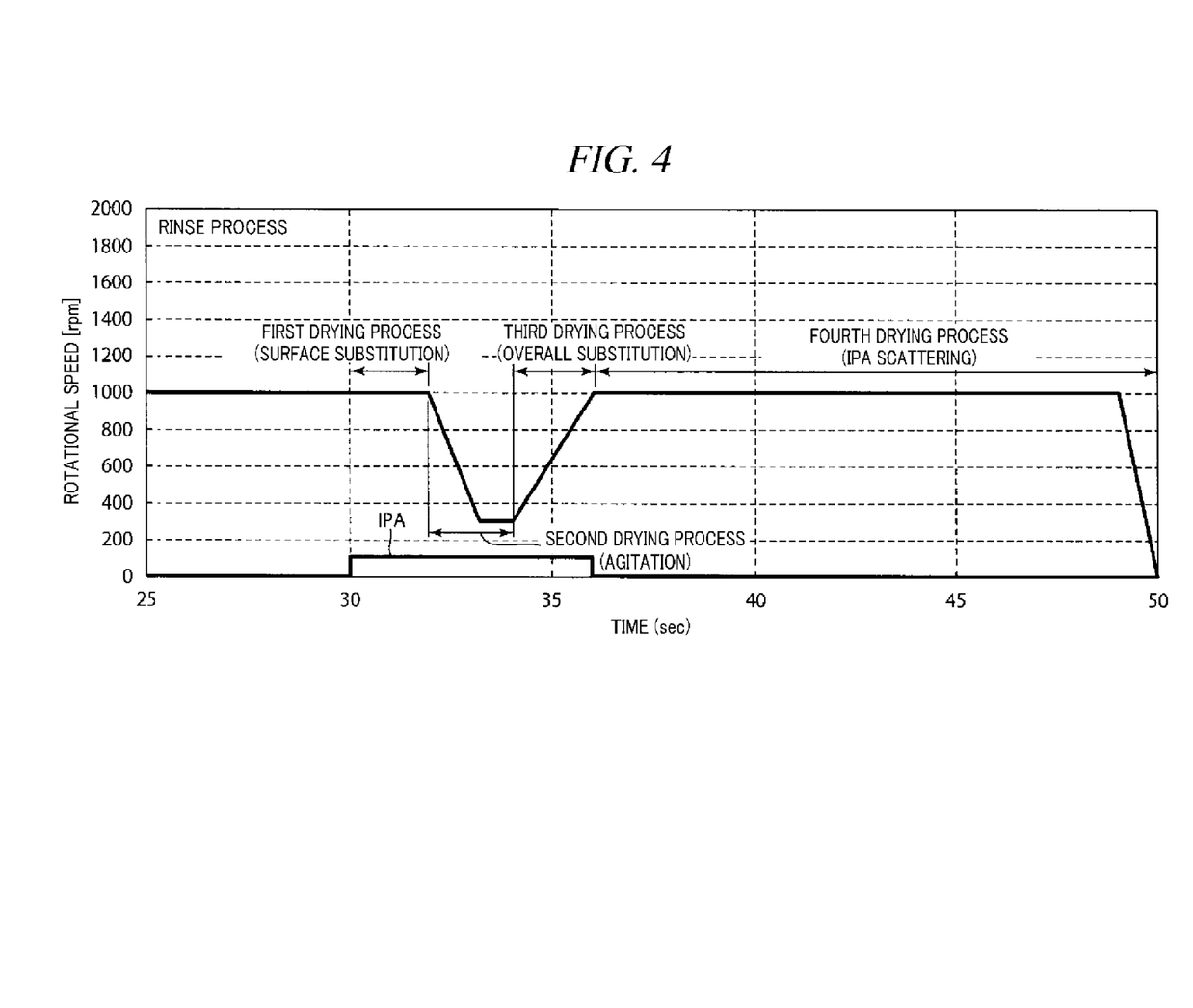
FIG. 4 is a graph showing a variation in a rotational speed of a substrate and a supply amount of an IPA solution during a drying process in the substrate processing method in accordance with the illustrative embodiment.

After the chemical liquid process is finished, the wafer W is rinsed while being rotated (rinse process, step S5), as depicted in FIG. 4. That is, the rinse liquid opening/closing valve 53 is opened, and pure water is discharged to the central portion of the surface of the wafer W from the rinse liquid supply source 52 via the rinse liquid supply line 51 and the cleaning solution nozzle 30. The discharged pure water is diffused to the entire surface of the wafer W by a centrifugal force, so that the chemical liquid remaining on the surface of the wafer W is washed away and a liquid film of pure water is formed on the surface of the wafer W. Here, desirably, the rotational speed of the wafer W may be set to be in the range from, e.g., about 500 rpm to about 1500 rpm. In this way, the chemical liquid can be rapidly washed away from the surface of the wafer W and the liquid film of pure water can be formed on the surface of the wafer W. After washing away the chemical liquid sufficiently, the supply of the rinse liquid is stopped by closing the rinse liquid opening/closing valve 53.

After the rinse process, as shown in FIG. 4, while rotating the wafer W, the wafer W is dried in the state where the supply of the rinse liquid is stopped (drying process, step S6).

The drying process is performed as follows. First, in the state where the liquid film of the pure wafer is formed on the surface of the wafer W, the wafer is rotated at a first rotational speed and the drying solution opening/closing valve 63 is opened. Accordingly, an IPA solution is supplied from the drying solution supply source 62 to the central portion of the wafer W via the drying solution supply line 61 and the drying solution nozzle 31 (in an amount of, e.g., about 125 mL/min). In this case, the drying solution nozzle 31 is located above the central portion of the wafer W. Further, the wafer W is rotated at the same rotational speed (e.g., about 1000 rpm) as the rotational speed (e.g., about 1000 rpm) in the rinse process (first drying process) (surface substitution).

In this first drying process, the IPA solution is diffused from the central portion of the wafer W to the periphery portion thereof by a centrifugal force. The rotational speed of the wafer W needs to be set to be a value that allows the IPA solution to be diffused toward the periphery portion of the wafer W from the central portion thereof. This rotational speed may be set to be a first rotational speed (e.g., about 1500 rpm) higher than the rotational speed in the rinse process or may be set to be a first rotational speed (e.g., about 800 rpm) lower than the rotational speed in the rinse process. When rotating the wafer W at the rotational speed higher than the rotational speed in the rinse process, it is possible to rapidly diffuse the IPA solution from the central portion of the wafer W to the periphery portion thereof while the pure wafer remains on the wafer W.

Figure 5:
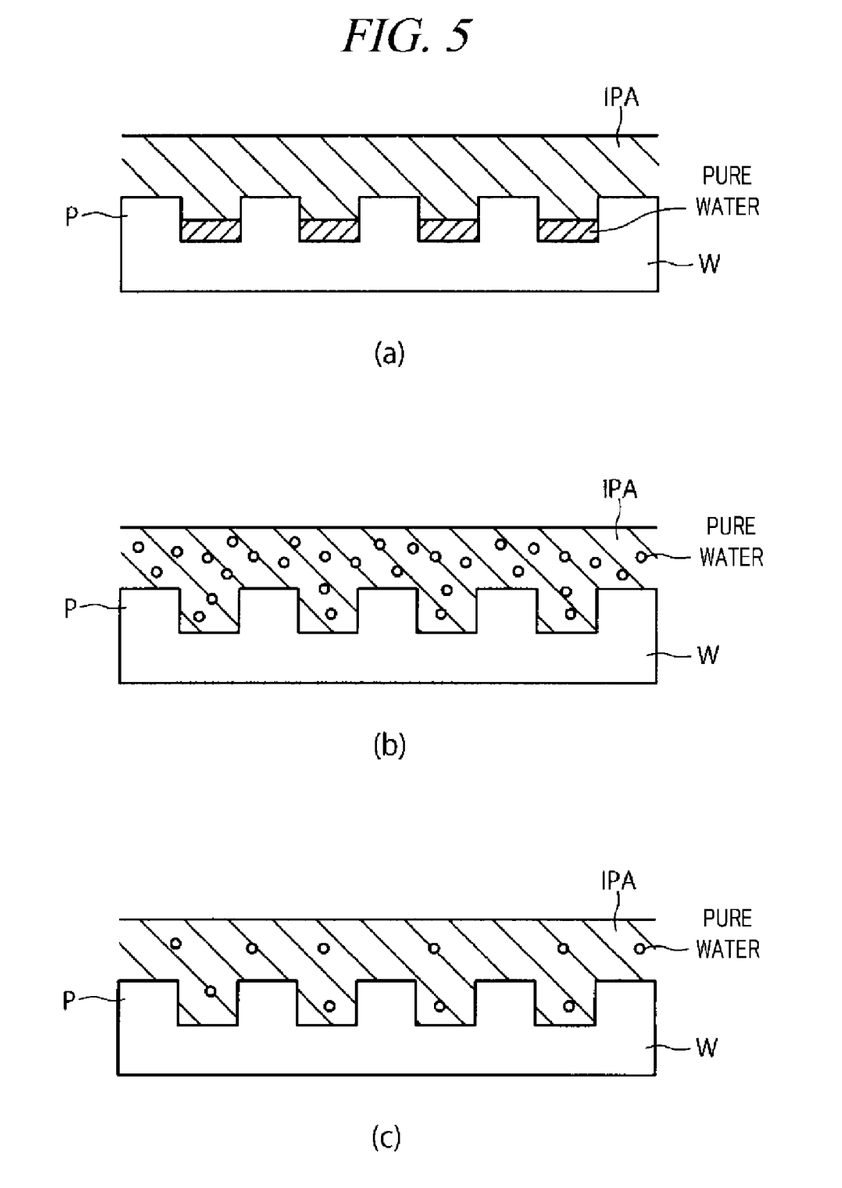
FIG. 5 provides diagrams illustrating behaviors of pure water and an IPA solution during the drying process in the substrate processing method in accordance with the illustrative embodiment.

Behaviors of the pure water and the IPA solution in the first drying process are illustrated in FIG. 5(a). As depicted in FIG. 5(a), in the first drying process, the IPA solution is diffused to the surface of the pure water, and the surface of the pure water is substituted with the IPA solution without exposing the pattern P of the wafer W. Further, a part of the pure water remains within the pattern P of the wafer W.

Subsequently, while supplying the IPA solution to the central portion of the wafer W (in an amount of, e.g., about 125 mL/min), the rotational speed of the wafer W is rapidly decreased to, e.g., about 300 rpm (second rotational speed) from, e.g., about 1000 rpm (first rotational speed) (second drying process) (agitation). Behaviors of the pure water and the IPA solution during this second drying process are illustrated in FIG. 5(b). As depicted in FIG. 5(b), by rapidly decreasing the rotational speed in the second drying process, the centrifugal force applied to the pure water and the IPA solution is also rapidly decreased, and an inertial force is applied to the pure water and the IPA solution that are diffusing from the central portion of the wafer W to the periphery portion thereof. As a result, a kind of quick braking effect is generated for the pure water and the IPA solution.

Accordingly, the pure water remaining within the pattern P of the wafer W is agitated and can be moved from the inside of the pattern P to the outside thereof. Further, by rotating the wafer W at the second rotational speed for a preset period of time, the pure water remaining within the pattern P can be sufficiently and uniformly substituted with the IPA solution, and the pure water moved to the outside of the pattern P is uniformly dispersed in the IPA solution.

Thereafter, while supplying the IPA solution to the central portion of the wafer W (in an amount of, e.g., about 125 mL/min), the rotational speed of the wafer W is gradually increased up to, e.g., about 1000 rpm (third rotational speed) (third drying process) (overall substitution).

Behaviors of the pure water and the IPA solution during this third drying process are illustrated in FIG. 5(c). As depicted in FIG. 5(c), the pure water is sufficiently substituted with the IPA solution by gradually increasing the rotational speed of the wafer W while supplying the IPA solution. Then, the IPA solution and the pure water uniformly dispersed in the IPA solution are removed from the central portion of the wafer W to the periphery portion thereof. As a result, it is possible to decrease the amount of the pure water in the IPA solution gradually.

Thereafter, the drying solution opening/closing valve 63 is closed and the supply of the IPA solution to the wafer W is stopped. At this time, the wafer W is still rotated at the third rotational speed (fourth drying process) (IPA scattering). Here, the supply of the IPA solution may be stopped before the rotational speed of the wafer W reaches the third rotational speed, as long as the IPA solution is supplied in an amount that allows the pure water to be sufficiently substituted with the IPA solution and allows the amount of the pure water in the IPA solution to be reduced. Further, the rotational speed in the fourth drying process may be set to be higher (e.g., about 1500 rpm) than the third rotational speed.

Through the fourth drying process, the IPA solution can be dried by being scattered.

Furthermore, in the fourth drying process, it may be also possible to supply a nitrogen gas ($N_2$ gas) to the wafer W, thus accelerating the scattering and drying of the IPA solution on the wafer W.

The supply of the nitrogen gas ($N_2$ gas) to the wafer W may be performed as follows.

First, a nitrogen gas is discharged to the surface of the wafer W from the gas nozzle 32, and the gas nozzle 32 is moved (scanned) from a position corresponding to the central portion of the wafer W to a position corresponding to the periphery portion thereof.

In this way, the IPA solution on the surface of the wafer W can be blown away by the nitrogen gas, so that the IPA solution can be rapidly removed from the surface of the wafer W and the wafer W can be dried.

After the gas nozzle 32 reaches the position corresponding to the periphery portion of the wafer W, the gas opening/closing valve 73 is closed and the supply of the nitrogen gas to the wafer W is stopped. Further, the rotational speed of the wafer W is decreased, and the drying process of the wafer W is finished.

Thereafter, the rotation of the wafer W is stopped. Then, in the reverse order to that in case of loading the wafer W, the non-illustrated transfer arm is moved to below the wafer and the wafer W is transferred onto the transfer arm and unloaded.

In accordance with the present illustrative embodiment as described above, in the first drying process, the IPA solution is supplied to the central portion of the wafer W while rotating the wafer W at the first rotational speed. Then, in the second drying process, the rotational speed of the wafer W is rapidly decreased to the second rotational speed while supplying the IPA solution to the wafer W continuously. Accordingly, the centrifugal force applied to the pure water and the IPA solution on the wafer W is decreased, and the inertial force is applied to the pure water and the IPA solution being diffused from the central portion of the wafer W to the periphery portion thereof. In such case, it is possible to make the pure water and the IPA solution caught in the braking state. As a result, the pure water and the IPA solution can be appropriately agitated on the wafer W, and the pure water on the wafer W can be substituted with the IPA solution sufficiently and uniformly. Thereafter, in the third drying process, the rotational speed of the wafer W is gradually increased to the third rotational speed from the second rotational speed while supplying the IPA solution, so that the IPA solution and the pure water dispersed in the IPA solution can be rapidly washed away from the central portion of the wafer W toward the periphery portion thereof. As a result, it is possible to reduce the amount of the pure water in the IPA solution.

Thereafter, in the fourth drying process, the IPA solution including the pure water is dried by being scattered. Accordingly, it is possible to prevent a particle such as a watermark from being generated on the surface of the wafer W.

The above illustrative embodiment is for the purpose of illustration, and is not intended to be limiting. Various changes and modifications may be made without departing from the meaning and scope of the present disclosure. Below, modification examples will be described.

The above illustrative embodiment has been described for the case of cleaning the wafer W by the DHF solution. However, the chemical liquid used for cleaning the wafer W may not be limited thereto, and various kinds of chemical liquids may be used.

Further, in accordance with the present illustrative embodiment, the pure water is used as the rinse liquid. However, the rinse liquid may not be limited to the pure water.

Although the present illustrative embodiment has been described for the case of using the IPA solution as the drying solution, the drying solution may not be limited to the IPA solution. By way of non-limiting example, an organic solvent having high volatility may be used as the drying solution.

Further, it may be also possible to supply heated IPA solution to the wafer W in order to accelerate evaporation of the IPA solution.

Further, in the above description, the substrate processing method, the storage medium storing thereon the computer program for implementing the substrate processing method and the substrate processing apparatus are applied to the cleaning process for the semiconductor wafer W, for example. However, the illustrative embodiment may not be limited thereto, but the substrate processing method, the storage medium and the substrate processing apparatus may also be applicable to the cleaning of various types of substrates such as a LCD substrate and a CD substrate.

Moreover, in the chemical liquid process and the rinse process, the wafer W is rotated. However, the illustrative embodiment may not be limited thereto, and the wafer W may not be rotated as long as the surface of the wafer W is covered with the liquids in the chemical liquid process and the rinse process.

Now, a modification example of the illustrative embodiment will be discussed with referent to FIGS. 6(a) to 6(d). The modification example shown in FIGS. 6(a) to 6(d) is different from the above-described illustrative embodiment depicted in FIGS. 1 to 5 in the fourth drying process, and other configurations are substantially identical to the above-described illustrative embodiment.

In the modification example of the present illustrative embodiment shown in FIGS. 6(a) to 6(d), the same parts as those in the present illustrative embodiment depicted in FIGS. 1 to 5 will be assigned same reference numerals, and redundant description thereof will be omitted.

In the above-described embodiment, the supply of the IPA solution to the wafer W is stopped at the beginning of the fourth drying process. In the present modification example, however, the drying solution opening/closing valve 63 is opened and the IPA solution is supplied to the wafer W during the fourth drying process (FIGS. 6(a) to 6(b)). Further, the inert gas such as a nitrogen gas ($N_2$ gas) is supplied to the wafer W on the way of the fourth drying process.

When the rotational speed of the wafer W reaches the third rotational speed and the fourth drying process is started, the drying solution nozzle 31 and the gas nozzle 32 are located at the position above the central portion of the wafer W, and the IPA solution is supplied from the drying solution nozzle 31 to the central portion of the wafer W. At this time, the supply of the nitrogen gas from the gas nozzle 32 is stopped (FIG. 6(a)).

Subsequently, the drying solution nozzle 31 and the gas nozzle 32 are moved from the central portion of the wafer W toward the periphery portion thereof at a first speed having a relatively low value (e.g., about 1.2 mm/s) while rotating the wafer W at the third rotational speed (FIG. 6(b)).

At this time, the IPA solution is supplied to the wafer W from the drying solution nozzle 31, whereas the supply of the nitrogen gas from the gas nozzle 32 is stopped. Further, the drying solution nozzle 31 is located ahead of the gas nozzle 32 in its moving direction.

In the vicinity of the center of the wafer W, the centrifugal force generated by the rotation of the wafer W is small. Thus, the force for scattering the IPA solution may not be so great, and the IPA solution may remain on the wafer W. By moving the drying solution nozzle 31 and the gas nozzle 32 at the first speed having the relatively low value, the IPA solution on the wafer W can be pushed away toward the periphery portion of the wafer W by the IPA solution supplied from the drying solution nozzle 31.

Meanwhile, at this stage, if the nitrogen gas is supplied to the wafer W from the gas nozzle 32, the nitrogen gas may be discharged onto the IPA solution remaining on the wafer W, and the thickness of the liquid film of the IPA solution on the wafer W may become non-uniform. In such a case, the drying process may not be performed efficiently.

In the modification example, however, the nitrogen gas is not supplied from the gas nozzle 32. Thus, the thickness of the liquid film of the IPA solution may not become non-uniform.

Figure 6:
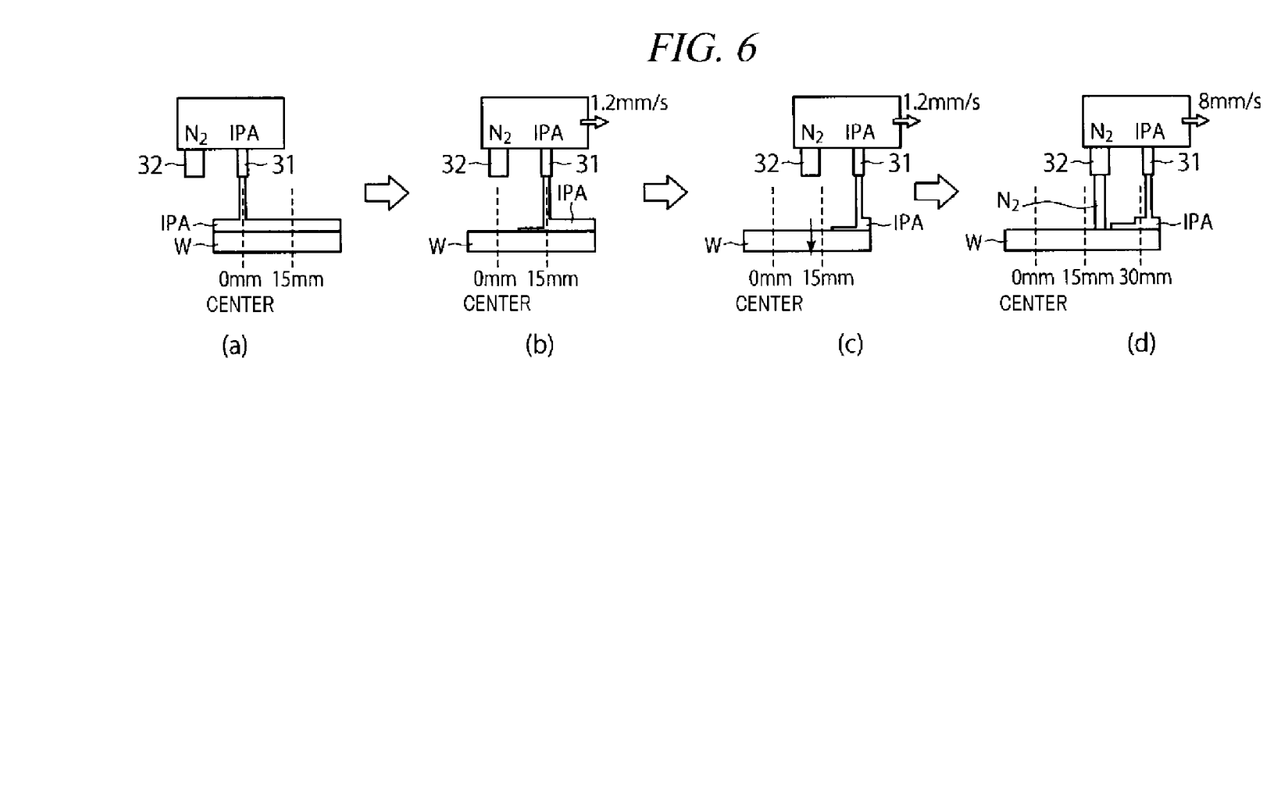
FIGS. 6(a) to 6(d) are diagrams illustrating operations of a drying solution nozzle and a gas nozzle in accordance with a modification example of the illustrative embodiment.

In this state, the gas nozzle 32 is moved to a position away from the center of the wafer W by, e.g., about 15 mm (FIG. 6(c)).

Further, the drying solution nozzle 31 and the gas nozzle 32 are moved toward the periphery portion of the wafer W. When the gas nozzle 32 reaches a position away from the center of the wafer W by more than, e.g., about 15 mm, that is, when the gas nozzle 32 reaches a position between the central portion of the wafer W and the periphery portion thereof, the nitrogen gas is discharged to the wafer W from the gas nozzle 32 (FIG. 6(d)).

At this time, the drying solution nozzle 31 is located at the position away from the center of the wafer W by, e.g., more than about 30 mm. Thereafter, the drying solution nozzle 31 and the gas nozzle 32 are moved toward the periphery portion of the wafer W at a second speed (e.g., about 8 mm/s) higher than the first speed (e.g., about 1.2 mm/s).

At a position away from the center of the wafer W by a certain distance, the centrifugal force generated by the rotation of the wafer W is increased. Accordingly, the IPA solution remaining on the surface of the wafer W can be more securely pushed away toward the periphery portion of the wafer W by the centrifugal force generated by the rotation of the wafer W and the nitrogen gas supplied from the gas nozzle 32.

Further, as illustrated in FIG. 6(d), at the position away from the center of the wafer W by the certain distance, since the large centrifugal force is applied due to the rotation of the wafer W as mentioned above, the amount of the IPA solution remaining on the wafer W can be reduced. Accordingly, even if the nitrogen gas is discharged to the wafer W from the gas nozzle 32, the thickness of the liquid film of the IPA solution on the wafer W may not become non-uniform.

In addition, as stated above, in the fourth drying process, the IPA solution is supplied onto the wafer W from the drying solution nozzle 31 while moving the drying solution nozzle 31 and the gas nozzle 32 from the central portion of the wafer W toward the periphery portion thereof. In the middle of the operation of moving the drying solution nozzle 31 and the gas nozzle 32, the nitrogen gas is supplied onto the wafer W from the gas nozzle 32.

Accordingly, the IPA solution does not remain on the wafer W, and it is possible to prevent a particle from being generated due to the IPA solution.

What is claimed is:
1. A substrate processing method comprising:
   a chemical liquid process that supplies a chemical liquid to a substrate;
   a rinse process that supplies a rinse liquid to the substrate after the chemical liquid process; and
   a drying process that dries the substrate after the rinse process,
   wherein the drying process comprises:
   a first drying process that rotates the substrate at a first rotational speed;
   a second drying process that decreases a rotational speed of the substrate to a second rotational speed lower than the first rotational speed after the first drying process; and a third drying process that increases the rotational speed of the substrate from the second rotational speed to a third rotational speed after the second drying process, and a drying solution is supplied to the substrate from a starting time point of the first drying process to a time point falling within the third drying process.

2. The substrate processing method of claim 1, wherein the drying process further comprises a fourth drying process that scatters away the drying solution by rotating the substrate at a fourth rotational speed after the third drying process, and the time point is an ending time point of the third drying process.

3. The substrate processing method of claim 1, wherein the time point is a time where the rotational speed of the substrate is higher than the second rotational speed and smaller than the third rotational speed.

4. The substrate processing method of claim 1, wherein the drying process further comprises:

a fourth drying process that scatters away the drying solution by rotating the substrate at a fourth rotational speed after the third drying process, the drying solution and an inert gas are supplied to the substrate in the fourth drying process, and a supplying position of the drying solution to the substrate is moved from a central portion of the substrate toward a periphery portion thereof and a supplying position of the inert gas is moved from between the central portion of the substrate and the periphery portion thereof toward the periphery portion thereof.

5. The substrate processing method of claim 4, wherein the supplying position of the drying solution is located ahead of the supplying position of the inert gas in a moving direction thereof.

6. The substrate processing method of claim 5, wherein in the fourth drying process, the supplying position of the drying solution is moved at a first speed when supplying only the drying solution to the substrate, and the supplying positions of the drying solution and the inert gas are moved at a second speed higher than the first speed when supplying both the drying solution and the inert gas to the substrate.

7. The substrate processing method of claim 1, wherein in the rinse process, the substrate is rotated at a fifth rotational speed and the rinse liquid is supplied to the substrate being rotated, and the first rotational speed is set to be higher than the fifth rotational speed.

* * * * *